United States Patent
Takami

(10) Patent No.: US 12,438,511 B2
(45) Date of Patent: Oct. 7, 2025

(54) MULTILAYER ELECTRONIC COMPONENT

(71) Applicant: TDK CORPORATION, Tokyo (JP)

(72) Inventor: Toshiyuki Takami, Tokyo (JP)

(73) Assignee: TDK CORPORATION, Tokyo (JP)

( * ) Notice: Subject to any disclaimer, the term of this patent is extended or adjusted under 35 U.S.C. 154(b) by 149 days.

(21) Appl. No.: 18/484,736

(22) Filed: Oct. 11, 2023

(65) Prior Publication Data

US 2024/0128944 A1    Apr. 18, 2024

(30) Foreign Application Priority Data

Oct. 18, 2022  (JP) ................. 2022-167044

(51) Int. Cl.
*H03H 7/01* (2006.01)
*H03H 7/46* (2006.01)
*H03H 1/00* (2006.01)

(52) U.S. Cl.
CPC ........ *H03H 7/0115* (2013.01); *H03H 7/1758* (2013.01); *H03H 7/1775* (2013.01); *H03H 7/46* (2013.01); *H03H 7/463* (2013.01); *H03H 2001/0085* (2013.01)

(58) Field of Classification Search
CPC .......... H03H 7/48; H03H 7/46; H03H 7/0115; H03H 2001/0085; H03H 7/463; H03H 7/468

USPC ......................................... 333/132, 175, 185
See application file for complete search history.

(56) References Cited

U.S. PATENT DOCUMENTS

2020/0228155 A1    7/2020  Kido
2020/0366264 A1*  11/2020  Nakashima .......... H03H 7/1766

* cited by examiner

*Primary Examiner* — Rakesh B Patel
(74) *Attorney, Agent, or Firm* — Oliff PLC

(57) ABSTRACT

An electronic component includes a stack including a plurality of first conductors and a plurality of second conductors. The plurality of first conductors include a first conductor group. The plurality of second conductors include a second conductor group arranged in a region adjacent to a region where the first conductor group is arranged. The plurality of first conductors further include a third conductor group arranged in a region adjacent to the region where the second conductor group is arranged and located to sandwich, with the region where the first conductor group is arranged, the region where the second conductor group is arranged. The first conductor group constitutes a plurality of parallel resonant circuits. The second conductor group constitutes a serial resonant circuit. The third conductor group constitutes another parallel resonant circuit.

7 Claims, 16 Drawing Sheets

MULTILAYER ELECTRONIC COMPONENT

CROSS REFERENCE TO RELATED APPLICATIONS

This application claims the benefit of Japanese Priority Patent Application No. 2022-167044 filed on Oct. 18, 2022, the entire contents of which are incorporated herein by reference.

BACKGROUND OF THE INVENTION

1. Field of the Invention

The present invention relates to a multilayer electronic component including a plurality of parallel resonant circuits and a plurality of serial resonant circuits.

2. Description of the Related Art

Compact mobile communication apparatuses are generally configured to use a single common antenna for a plurality of applications that use different systems and have different service frequency bands, and to use a branching filter to separate a plurality of signals received and transmitted by the antenna from each other.

A branching filter for separating a first signal of a frequency within a first frequency band and a second signal of a frequency within a second frequency band higher than the first frequency band from each other typically includes a common port, a first signal port, a second signal port, a first filter provided in a first signal path leading from the common port to the first signal port, and a second filter provided in a second signal path leading from the common port to the second signal port. As the first and second filters, an LC parallel resonator and an LC serial resonator including inductors and capacitors are used, for example.

The recent market demands for reductions in size and footprint of the compact mobile communication apparatuses and also requires downsizing of branching filters for use in those communication apparatuses. If the branching filters are reduced in size, electromagnetic coupling between the resonators can sometimes be too strong. This has sometimes interfered with the implementation of desired characteristics.

US 2020/0228155 A1 discloses a high frequency filter including an LC parallel resonant circuit and an LC serial resonant circuit. The LC parallel resonant circuit and the LC serial resonant circuit are provided on a path connecting two input/output terminals. US 2020/0228155 A1 discloses a technique of configuring the direction of magnetic flux of an inductor of the LC parallel resonant circuit and the direction of magnetic flux of an inductor of the LC serial resonant circuit to be orthogonal to each other, thereby preventing electromagnetic coupling between the inductor of the LC parallel resonant circuit and the inductor of the LC serial resonant circuit.

As a branching filter suitable for downsizing, a branching filter including a stack including a plurality of dielectric layers and a plurality of conductor layers stacked together is known. In the technique disclosed in US 2020/0228155 A1, space for arranging the two inductors in different directions is needed. Hence, there is a problem that, in a case of applying the technique disclosed in US 2020/0228155 A1 to a branching filter including a stack, unnecessary space is formed in the stack, which makes it difficult to downsize the branching filter.

In addition, as the number of signals to be branched by the branching filter increases, the number of LC parallel resonators and the number of LC serial resonators increase. For this reason, the foregoing problem is significant in multiplexers such as triplexers and quadplexers.

The foregoing problem is not limited to branching filters and applies to multilayer electronic components in general that include a plurality of parallel resonant circuits and a plurality of serial resonant circuits.

SUMMARY OF THE INVENTION

An objective of the present invention is to provide a multilayer electronic component that can be downsized while an influence of electromagnetic coupling between parallel resonant circuits and serial resonant circuits is reduced.

A multilayer electronic component of the present invention includes: an input terminal; a plurality of output terminals; a plurality of parallel resonant circuits; a plurality of serial resonant circuits; and a stack including a plurality of dielectric layers stacked together, a plurality of first conductors, and a plurality of second conductors. The plurality of first conductors constitute one of the plurality of parallel resonant circuits and the plurality of serial resonant circuits. The plurality of second conductors constitute the other of the plurality of parallel resonant circuits and the plurality of serial resonant circuits. The plurality of first conductors include a first conductor group. The plurality of second conductors include a second conductor group arranged in a region adjacent to a region where the first conductor group is arranged. The plurality of first conductors further include a third conductor group arranged in a region adjacent to the region where the second conductor group is arranged and located to sandwich, with the region where the first conductor group is arranged, the region where the second conductor group is arranged.

The plurality of output terminals include a first terminal, a second terminal, and a third terminal. The first conductor group constitutes at least part of a circuit provided on a path connecting the input terminal and the first terminal. The second conductor group constitutes at least part of a circuit provided on a path connecting the input terminal and the second terminal. The third conductor group constitutes at least part of a circuit provided on a path connecting the input terminal and the third terminal.

In the multilayer electronic component of the present invention, the first conductor group, the second group, and the third conductor group are arranged as described above. Thus, according to the present invention, it is possible to downsize the multilayer electronic component while reducing an influence of electromagnetic coupling between the parallel resonant circuits and the serial resonant circuits.

Other and further objects, features and advantages of the present invention will appear more fully from the following description.

DETAILED DESCRIPTION OF THE PREFERRED EMBODIMENTS

Figure 1:
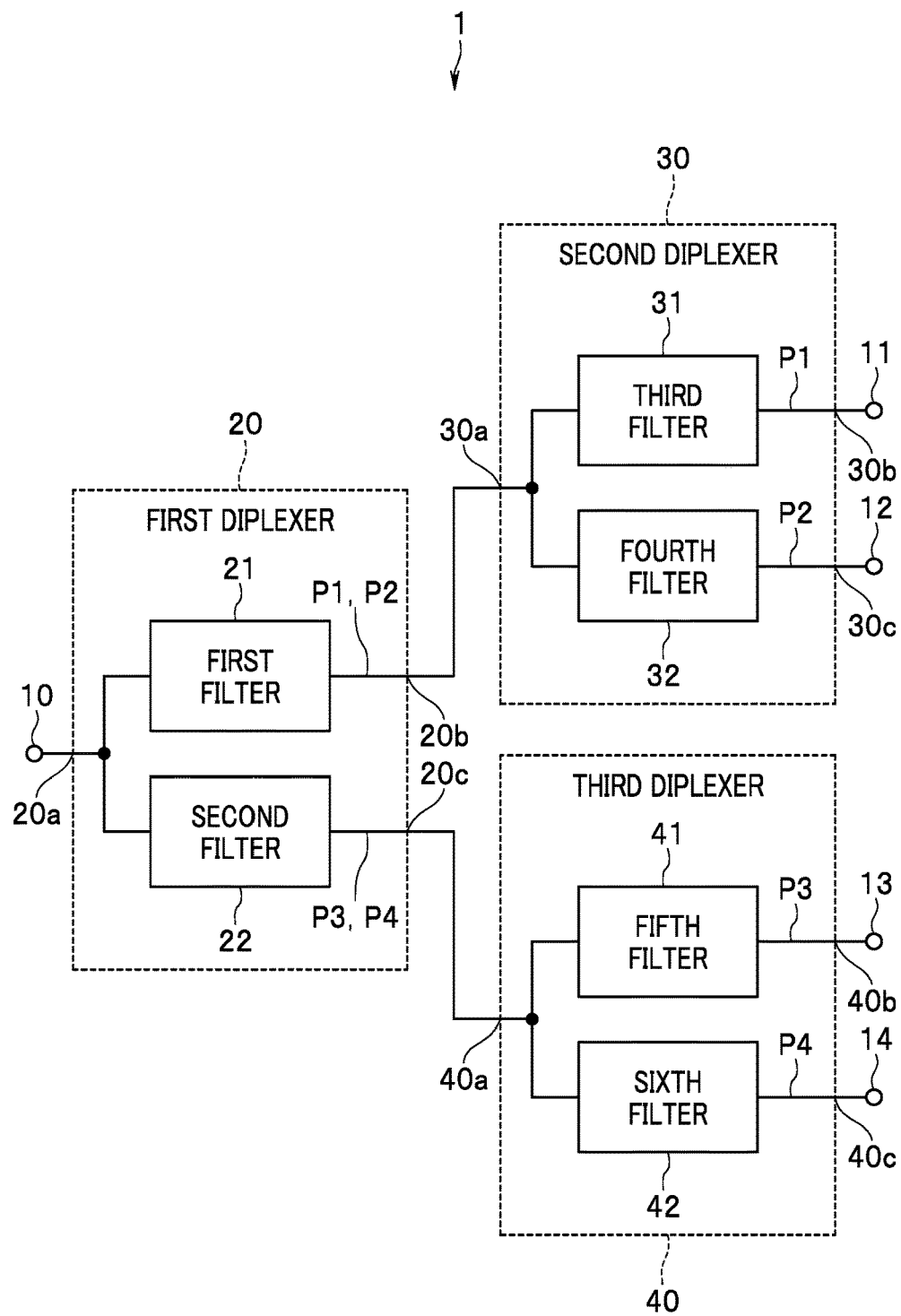
FIG. 1 is a block diagram showing a configuration of a multilayer electronic component according to an embodiment of the present invention.

An embodiment of the present invention will now be described in detail with reference to the drawings. First, a configuration of a multilayer electronic component (hereinafter simply referred to as an electronic component) 1 according to the embodiment of the present invention will be outlined with reference to FIG. 1. FIG. 1 is a block diagram showing a configuration of the electronic component 1. FIG. 1 shows a branching filter (quadplexer) as an example of the electronic component 1.

The electronic component 1 includes an input port 10 and a plurality of output ports. In the present embodiment, the plurality of output ports include a first output port 11, a second output port 12, a third output port 13, and a fourth output port 14. The first output port 11 is configured to selectively pass a signal of a frequency within a first passband. The second output port 12 is configured to selectively pass a signal of a frequency within a second passband. The third output port 13 is configured to selectively pass a signal of a frequency within a third passband. The fourth output port 14 is configured to selectively pass a signal of a frequency within a fourth passband.

The second passband is a frequency band higher than the first passband. The fourth passband is a frequency band higher than the third passband. The third passband may be a frequency band higher than the second passband. Alternatively, the fourth passband may be a frequency band lower than the first passband. In this case, the third passband is also a frequency band lower than the first passband. In the following description, the third passband is assumed as a frequency band higher than the second passband.

The electronic component 1 further includes a first diplexer 20, a second diplexer 30, and a third diplexer 40. The first diplexer 20 includes an input end 20a and two output ends 20b and 20c. The input end 20a of the first diplexer 20 is connected to the input port 10.

The second diplexer 30 includes an input end 30a and two output ends 30b and 30c. The second diplexer 30 is provided between the output end 20b of the first diplexer 20 and the first and second output ports 11 and 12 in circuit configuration. The input end 30a of the second diplexer 30 is connected to the output end 20b of the first diplexer 20. The output end 30b of the second diplexer 30 is directly connected to the first output port 11. The output end 30c of the second diplexer 30 is directly connected to the second output port 12.

The third diplexer 40 includes an input end 40a and two output ends 40b and 40c. The third diplexer 40 is provided between the output end 20c of the first diplexer 20 and the third and fourth output ports 13 and 14 in circuit configuration. The input end 40a of the third diplexer 40 is connected to the output end 20c of the first diplexer 20. The output end 40b of the third diplexer 40 is directly connected to the third output port 13. The output end 40c of the third diplexer 40 is directly connected to the fourth output port 14.

Note that, in the present application, the expression "in circuit configuration" is used to indicate arrangement in a circuit diagram, but not arrangement in physical configuration.

The first diplexer 20 is configured to selectively pass a signal of a frequency band including the second passband but not including the third passband through the output end 20b and selectively pass a signal of a frequency band including the third passband but not including the second passband through the output end 20c. In the present embodiment, in particular, the first diplexer 20 includes a first filter 21 provided between the input end 20a and the output end 20b in circuit configuration and a second filter 22 provided between the input end 20a and the output end 20c in circuit configuration. The first filter 21 is a filter configured to selectively pass a signal of a frequency band including the first passband and the second passband but not including the third passband. The second filter 22 is a filter configured to selectively pass a signal of a frequency band including the third passband and the fourth passband but not including the second passband.

The second diplexer 30 is configured to selectively pass a signal of a frequency within the first passband through the output end 30b and selectively pass a signal of a frequency within the second passband through the output end 30c. In the present embodiment, in particular, the second diplexer 30 includes a third filter 31 provided between the input end 30a and the output end 30b in circuit configuration and a fourth filter 32 provided between the input end 30a and the output end 30c in circuit configuration. The third filter 31 is a filter configured to selectively pass a signal of a frequency within the first passband. The fourth filter 32 is a filter configured to selectively pass a signal of a frequency within the second passband.

The third diplexer 40 is configured to selectively pass a signal of a frequency within the third passband through the output end 40b and selectively pass a signal of a frequency within the fourth passband through the output end 40c. In the present embodiment, in particular, the third diplexer 40 includes a fifth filter 41 provided between the input end 40a and the output end 40b in circuit configuration and a sixth filter 42 provided between the input end 40a and the output end 40c in circuit configuration. The fifth filter 41 is a filter configured to selectively pass a signal of a frequency within the third passband. The sixth filter 42 is a filter configured to selectively pass a signal of a frequency within the fourth passband.

The electronic component 1 further includes a first path P1 connecting the input port 10 and the first output port 11, a second path P2 connecting the input port 10 and the second output port 12, a third path P3 connecting the input port 10 and the third output port 13, and a fourth path P4 connecting the input port 10 and the fourth output port 14. The first and second paths P1 and P2 are common paths from the input end 20a of the first diplexer 20 to the input end 30a of the second diplexer 30. The third and fourth paths P3 and P4 are common paths from the input end 20a of the first diplexer 20 to the input end 40a of the third diplexer 40.

The first filter 21 is provided on a path connecting the input end 20a and the output end 20b of the first diplexer 20 and constituting part of each of the first and second paths P1 and P2. The second filter 22 is provided on a path connecting the input end 20a and the output end 20c of the first diplexer 20 and constituting part of each of the third and fourth paths P3 and P4.

The third and fourth filters 31 and 32 are provided at a subsequent stage of the first filter 21. The first and second paths P1 and P2 branch at the subsequent stage of the first filter 21. The third filter 31 is provided on the first path P1. The fourth filter 32 is provided on the second path P2.

The fifth and sixth filters 41 and 42 are provided at a subsequent stage of the second filter 22. The third and fourth paths P3 and P4 branch at the subsequent stage of the second filter 22. The fifth filter 41 is provided on the third path P3. The sixth filter 42 is provided on the fourth path P4.

A first signal of a frequency within the first passband input to the input port 10 selectively passes the first path P1, specifically, the first and third filters 21 and 31, and is output from the first output port 11. A second signal of a frequency within the second passband input to the input port 10 selectively passes the second path P2, specifically, the first and fourth filters 21 and 32, and is output from the second output port 12. A third signal of a frequency within the third passband input to the input port 10 selectively passes the third path P3, specifically, the second and fifth filters 22 and 41, and is output from the third output port 13. A fourth signal of a frequency within the fourth passband input to the input port 10 selectively passes the fourth path P4, specifically, the second and sixth filters 22 and 42, and is output from the fourth output port 14. In such a manner, the electronic component 1 separates the first to fourth signals.

Figure 2:
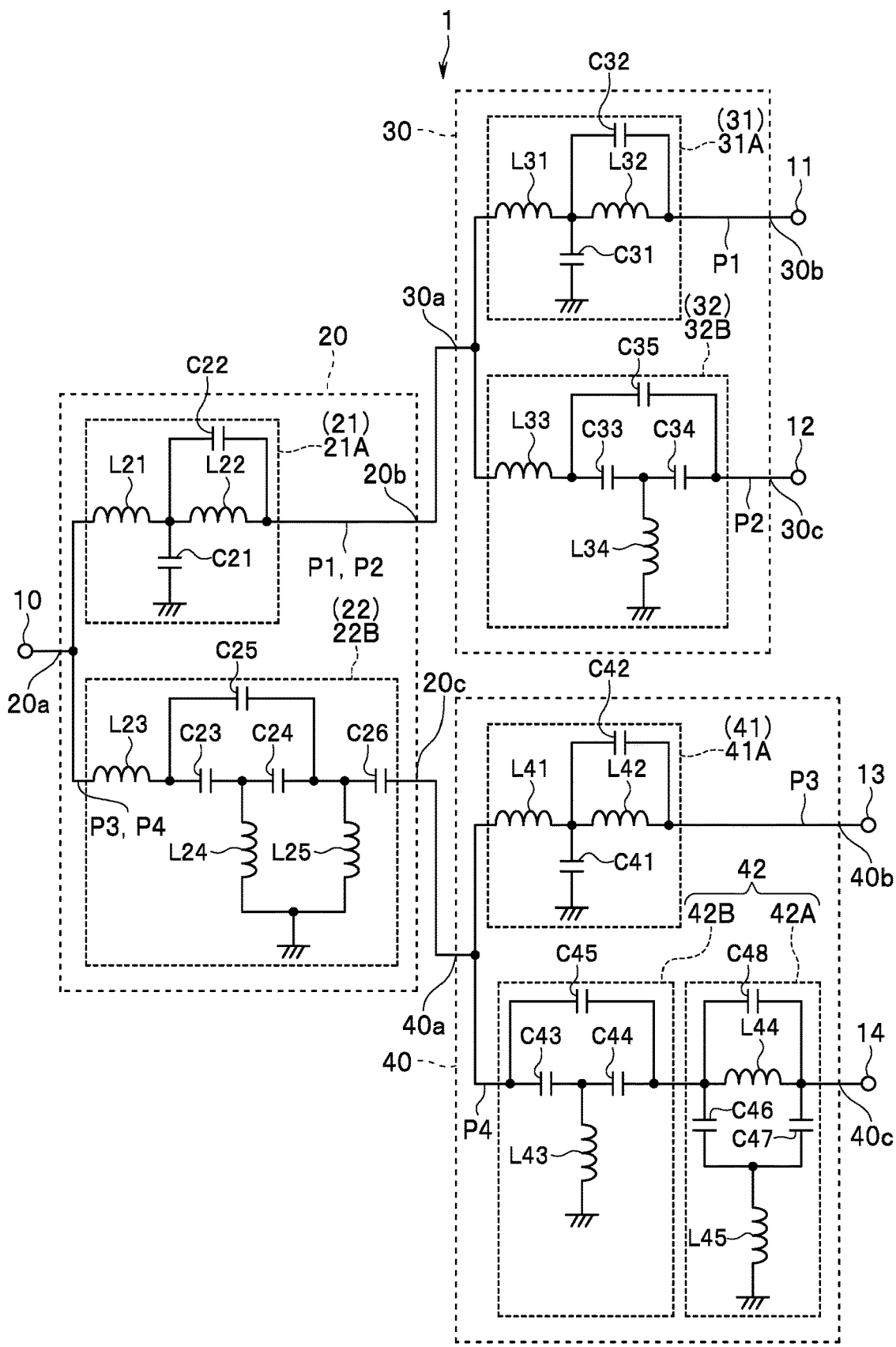
FIG. 2 is a circuit diagram showing an example of a circuit configuration of the multilayer electronic component according to the embodiment of the present invention.

Next, an example of a circuit configuration of the electronic component 1 will be described with reference to FIG. 2. FIG. 2 is a circuit diagram showing an example of the circuit configuration of the electronic component 1.

First, a configuration of the first diplexer 20 will be described. The first filter 21 of the first diplexer 20 includes a parallel resonant circuit 21A. In the present embodiment, in particular, the first filter 21 is entirely constituted by the parallel resonant circuit 21A.

The second filter 22 of the first diplexer 20 includes a serial resonant circuit 22B. In the present embodiment, in particular, the second filter 22 is entirely constituted by the serial resonant circuit 22B.

The parallel resonant circuit is a resonant circuit configured to have the lowest current with a specific element parameter in a specific frequency. In the parallel resonant circuit, a capacitor is provided between a signal path (for example, the first to fourth paths P1 to P4) and ground. The serial resonant circuit is a resonant circuit configured to have the highest current with a specific element parameter in a specific frequency, for example. In the serial resonant circuit, no capacitor is provided between the signal path and the ground.

The first filter 21 (parallel resonant circuit 21A) includes inductors L21 and L22 and capacitors C21 and C22. One end of the inductor L21 is connected to the input end 20a of the first diplexer 20. One end of the inductor L22 is connected to the other end of the inductor L21. The other end of the inductor L22 is connected to the output end 20b of the first diplexer 20.

One end of the capacitor C21 is connected to a connection point between the inductors L21 and L22. The other end of the capacitor C21 is connected to the ground. The capacitor C22 is connected in parallel with the inductor L22.

The second filter 22 (serial resonant circuit 22B) includes inductors L23, L24, and L25, and capacitors C23, C24, C25, and C26. One end of the inductor L23 is connected to the input end 20a of the first diplexer 20.

One end of the capacitor C23 is connected to the other end of the inductor L23. One end of the capacitor C24 is connected to the other end of the capacitor C23. One end of the capacitor C25 is connected to the one end of the capacitor C23. The other end of the capacitor C25 and one end of the capacitor C26 are connected to the other end of the capacitor C24. The other end of the capacitor C26 is connected to the output end 20c of the first diplexer 20.

One end of the inductor L24 is connected to a connection point between the capacitor C23 and the capacitor C24. One end of the inductor L25 is connected to a connection point between the capacitor C24 and the capacitor C25. The other end of each of the inductors L24 and L25 is connected to the ground.

Next, a configuration of the second diplexer 30 will be described. The third filter 31 of the second diplexer 30 includes a parallel resonant circuit 31A. In the present embodiment, in particular, the third filter 31 is entirely constituted by the parallel resonant circuit 31A.

The fourth filter 32 of the second diplexer 30 includes a serial resonant circuit 32B. In the present embodiment, in particular, the fourth filter 32 is entirely constituted by the serial resonant circuit 32B.

The third filter 31 (parallel resonant circuit 31A) includes inductors L31 and L32 and capacitors C31 and C32. One end of the inductor L31 is connected to the input end 30a of the second diplexer 30. One end of the inductor L32 is connected to the other end of the inductor L31. The other end of the inductor L32 is connected to the output end 30b of the second diplexer 30.

One end of the capacitor C31 is connected to a connection point between the inductors L31 and L32. The other end of the capacitor C31 is connected to the ground. The capacitor C32 is connected in parallel with the inductor L32.

The fourth filter 32 (serial resonant circuit 32B) includes inductors L33 and L34 and capacitors C33, C34, and C35. One end of the inductor L33 is connected to the input end 30a of the second diplexer 30.

One end of the capacitor C33 is connected to the other end of the inductor L33. One end of the capacitor C34 is connected to the other end of the capacitor C33. The other end of the capacitor C34 is connected to the output end 30c of the second diplexer 30. One end of the capacitor C35 is connected to the one end of the capacitor C33. The other end of the capacitor C35 is connected to the other end of the capacitor C34.

One end of the inductor L34 is connected to a connection point between the capacitor C33 and the capacitor C34. The other end of the inductor L34 is connected to the ground.

Next, a configuration of the third diplexer 40 will be described. The fifth filter 41 of the third diplexer 40 includes a parallel resonant circuit 41A. In the present embodiment, in particular, the fifth filter 41 is entirely constituted by the parallel resonant circuit 41A.

The sixth filter 42 of the third diplexer 40 includes a serial resonant circuit 42B and a parallel resonant circuit 42A. The serial resonant circuit 42B and the parallel resonant circuit 42A are provided in this order from the input end 40a side of the third diplexer 40 in circuit configuration.

The fifth filter 41 (parallel resonant circuit 41A) includes inductors L41 and L42 and capacitors C41 and C42. One end of the inductor L41 is connected to the input end 40a of the third diplexer 40. One end of the inductor L42 is connected to the other end of the inductor L41. The other end of the inductor L42 is connected to the output end 40b of the third diplexer 40.

One end of the capacitor C41 is connected to a connection point between the inductors L41 and L42. The other end of the capacitor C41 is connected to the ground. The capacitor C42 is connected in parallel with the inductor L42.

The serial resonant circuit 42B of the sixth filter 42 includes an inductor L43 and capacitors C43, C44, and C45. One end of the capacitor C43 is connected to the input end 40a of the third diplexer 40. One end of the capacitor C44 is connected to the other end of the capacitor C43. One end of the capacitor C45 is connected to the one end of the capacitor C43. The other end of the capacitor C45 is connected to the other end of the capacitor C44.

One end of the inductor L43 is connected to a connection point between the capacitor C43 and the capacitor C44. The other end of the inductor L43 is connected to the ground.

The parallel resonant circuit 42A of the sixth filter 42 includes inductors L44 and L45 and capacitors C46, C47, and C48. One end of the inductor L44 is connected to the other end of the capacitor C44 of the serial resonant circuit 42B. The other end of the inductor L44 is connected to the output end 40c of the third diplexer 40.

One end of the capacitor C46 and one end of the capacitor C48 are connected to the one end of the inductor L44. One end of the capacitor C47 and the other end of the capacitor C48 are connected to the other end of the inductor L44.

One end of the inductor L45 is connected to the other end of each of the capacitors C46 and C47. The other end of the inductor L45 is connected to the ground. The parallel resonant circuit 21A is provided on a path connecting the input end 20a and the output end 20b of the first diplexer 20 and constituting part of each of the first and second paths P1 and P2. The serial resonant circuit 22B is provided on a path connecting the input end 20a and the output end 20b of the first diplexer 20 and constituting part of each of the third and fourth paths P3 and P4.

The parallel resonant circuit 31A and the serial resonant circuit 32B are provided at a subsequent stage of the parallel resonant circuit 21A. The parallel resonant circuit 31A is provided on the first path P1. The serial resonant circuit 32B is provided on the second path P2.

The parallel resonant circuit 41A and the serial resonant circuit 42B are provided at a subsequent stage of the serial resonant circuit 22B. The parallel resonant circuit 41A is provided on the third path P3. The serial resonant circuit 42B is provided on the fourth path P4.

The parallel resonant circuit 42A is provided at a subsequent stage of the serial resonant circuit 42B. The parallel resonant circuit 42A is provided on the fourth path P4.

Figure 3:
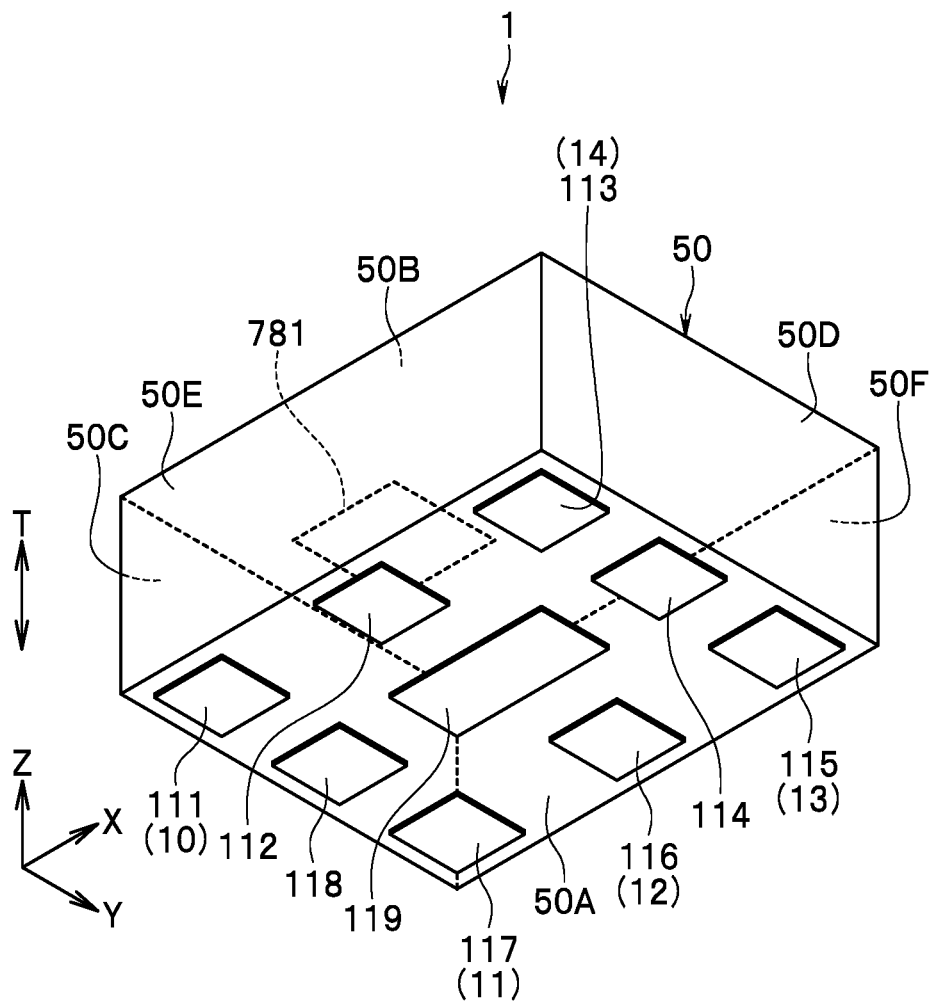
FIG. 3 is a perspective view showing an appearance of the multilayer electronic component according to the embodiment of the present invention.

Next, other configurations of the electronic component 1 will be described with reference to FIG. 3. FIG. 3 is a perspective view showing an appearance of the electronic component 1.

The electronic component 1 further includes a stack 50 including a plurality of dielectric layers and a plurality of conductors stacked together. The stack 50 is intended to integrate the input port 10, the first to fourth output ports 11 to 14, and the first to third diplexers 20, 30, and 40. The first to third diplexers 20, 30, and 40 are each constituted by using a plurality of conductors.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other, and the side surfaces 50E and 50F are also opposite to each other. The side surfaces 50C to 50F are perpendicular to the top surface 50B and the bottom surface 50A.

Here, X, Y, and Z directions are defined as shown in FIG. 3. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively. The expression "when viewed in the stacking direction T" means that an object is viewed from a position away in the Z direction or the −Z direction.

As shown in FIG. 3, the bottom surface 50A is located at the end of the stack 50 in the −Z direction. The top surface 50B is located at the end of the stack 50 in the Z direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The electronic component 1 further includes an input terminal 111 and a plurality of output terminals. The plurality of output terminals include output terminals 113, 115, 116, and 117. The electronic component 1 further includes ground terminals 112, 114, 118, and 119 connected to the ground. The input terminal 111, the output terminals 113, 115, 116, and 117, and the ground terminals 112, 114, 118, and 119 are provided on the bottom surface 50A of the stack 50.

The input terminal 111 is arranged near a corner at a position where the bottom surface 50A, the side surface 50C, and the side surface 50E intersect one another. The output terminal 113 is arranged near a corner at a position where the bottom surface 50A, the side surface 50D, and the side surface 50E intersect one another. The output terminal 115 is arranged near a corner at a position where the bottom surface 50A, the side surface 50D, and the side surface 50F intersect one another. The output terminal 117 is arranged near a corner at a position where the bottom surface 50A, the side surface 50C, and the side surface 50F intersect one another.

The ground terminal 112 is arranged between the input terminal 111 and the output terminal 113. The ground terminal 114 is arranged between the output terminal 113 and the output terminal 115. The output terminal 116 is arranged between the output terminal 115 and the output terminal 117. The ground terminal 118 is arranged between the input terminal 111 and the output terminal 117. The ground terminal 119 is arranged at a center of the bottom surface 50A.

The input terminal 111 corresponds to the input port 10, the output terminal 113 corresponds to the fourth output port 14, the output terminal 115 corresponds to the third output port 13, the output terminal 116 corresponds to the second output port 12, and the output terminal 117 corresponds to the first output port 11. Hence, the input port 10 and the first to fourth output ports 11 to 14 are provided on the bottom surface 50A of the stack 50.

Next, an example of the plurality of dielectric layers and the plurality of conductors constituting the stack 50 will be described with reference to FIG. 4A to FIG. 13. In this example, the stack 50 includes twenty-eight dielectric layers stacked together. The twenty-eight dielectric layers will be referred to as a first to a twenty-eighth dielectric layer in the order from bottom to top. The first to twenty-eighth dielectric layers are denoted by reference numerals 51 to 78, respectively.

In FIG. 4A to FIG. 12B, each circle represents a through hole. The dielectric layers 51 to 76 each have a plurality of through holes. The through holes are each formed by filling a hole intended for a through hole with a conductive paste. Each of the through holes is connected to a conductor layer or another through hole.

Figure 4A:
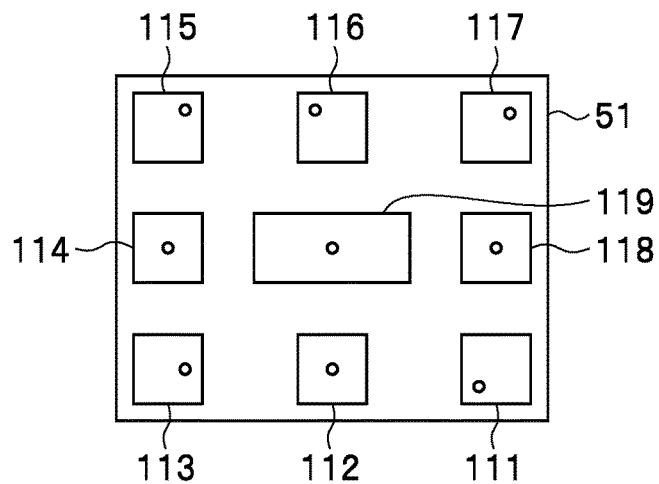
FIG. 4A to FIG. 4C are explanatory diagrams showing respective patterned surfaces of first to third dielectric layers of a stack of the multilayer electronic component according to the embodiment of the present invention.
Figure 4B:
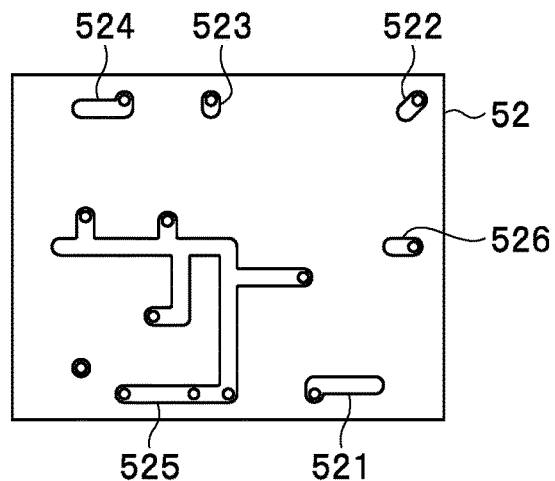

FIG. 4A shows a patterned surface of the first dielectric layer 51. The input terminal 111, the output terminals 113, 115, 116, and 117, and the ground terminals 112, 114, 118, and 119 are formed on the patterned surface of the dielectric layer 51. FIG. 4B shows a patterned surface of the second dielectric layer 52. Conductor layers 521, 522, 523, 524, 525, and 526 are formed on the patterned surface of the dielectric layer 52.

Figure 4C:
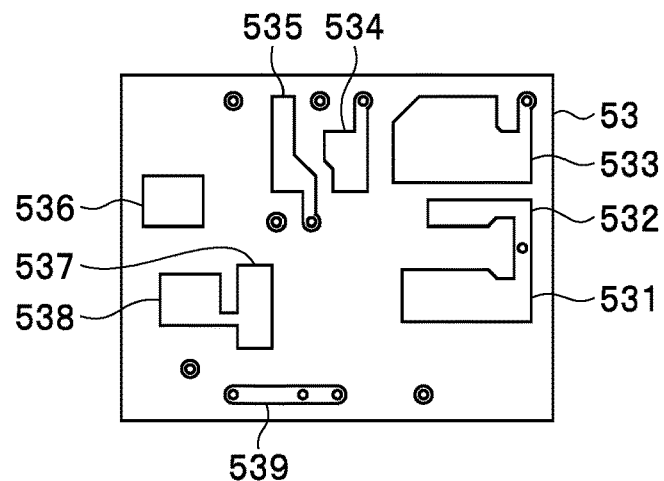

FIG. 4C shows a patterned surface of the third dielectric layer 53. Conductor layers 531, 532, 533, 534, 535, 536, 537, 538, and 539 are formed on the patterned surface of the dielectric layer 53. The conductor layer 532 is connected to the conductor layer 531. The conductor layer 538 is connected to the conductor layer 537.

Figure 5A:
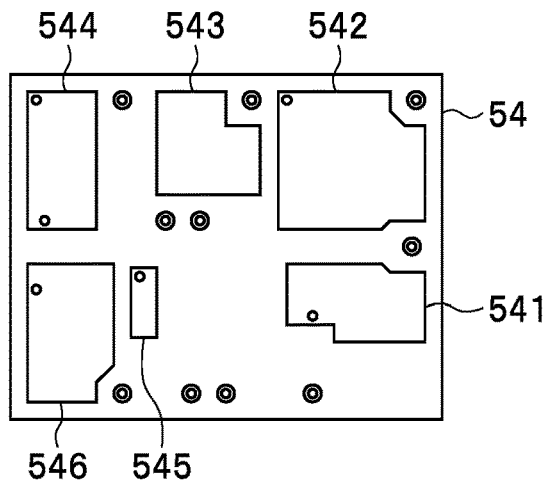
FIG. 5A to FIG. 5C are explanatory diagrams showing respective patterned surfaces of fourth to sixth dielectric layers of the stack of the multilayer electronic component according to the embodiment of the present invention.
Figure 5B:
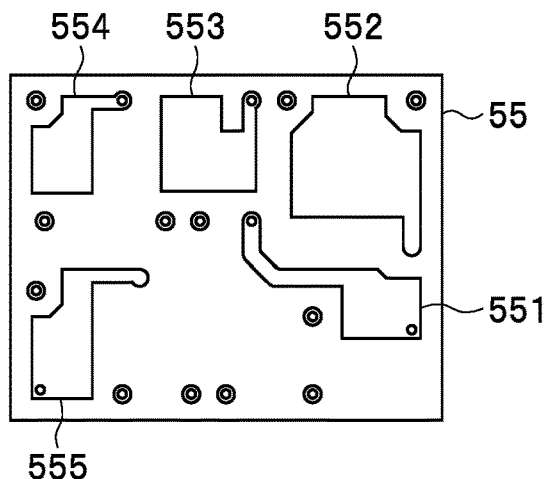
Figure 5C:
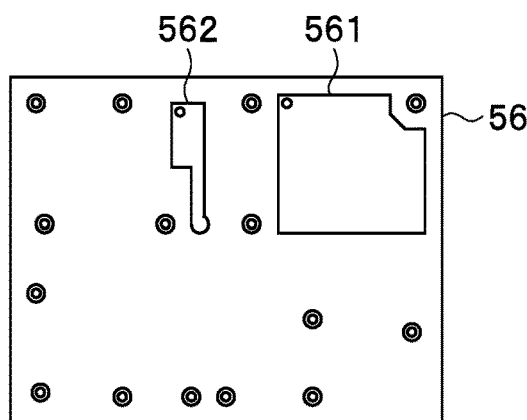

FIG. 5A shows a patterned surface of the fourth dielectric layer 54. Conductor layers 541, 542, 543, 544, 545, and 546 are formed on the patterned surface of the dielectric layer 54. FIG. 5B shows a patterned surface of the fifth dielectric layer 55. Conductor layers 551, 552, 553, 554, and 555 are formed on the patterned surface of the dielectric layer 55. FIG. 5C shows a patterned surface of the sixth dielectric layer 56. Conductor layers 561 and 562 are formed on the patterned surface of the dielectric layer 56.

Figure 6A:
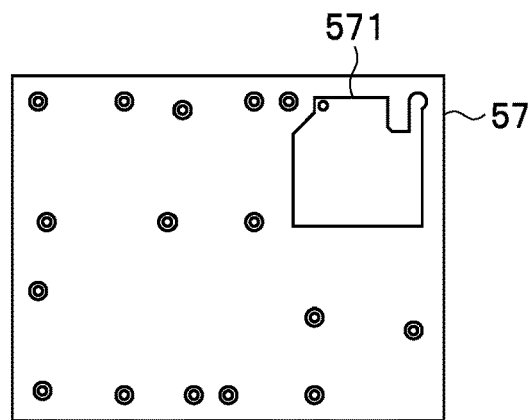
FIG. 6A to FIG. 6C are explanatory diagrams showing respective patterned surfaces of seventh to ninth dielectric layers of the stack of the multilayer electronic component according to the embodiment of the present invention.
Figure 6B:
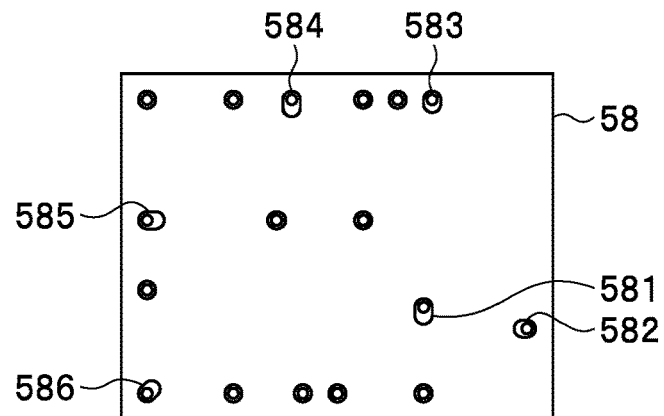
Figure 6C:
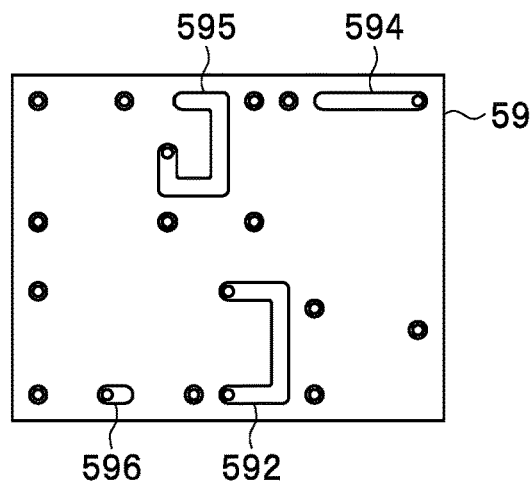

FIG. 6A shows a patterned surface of the seventh dielectric layer 57. A conductor layer 571 is formed on the patterned surface of the dielectric layer 57. FIG. 6B shows a patterned surface of the eighth dielectric layer 58. Conductor layers 581, 582, 583, 584, 585, and 586 are formed on the patterned surface of the dielectric layer 58. FIG. 6C shows a patterned surface of the ninth dielectric layer 59. Conductor layers 592, 594, 595, and 596 are formed on the patterned surface of the dielectric layer 59.

Figure 7A:
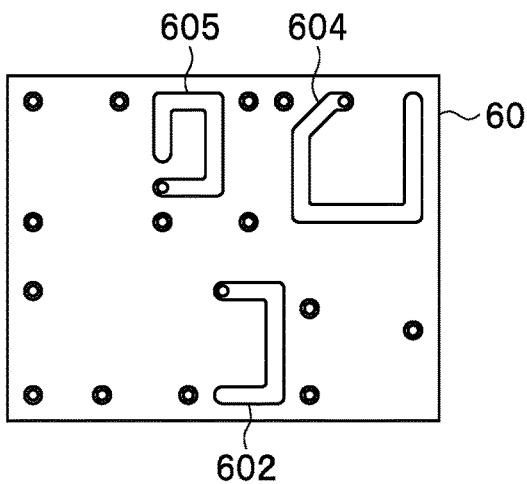
FIG. 7A to FIG. 7C are explanatory diagrams showing respective patterned surfaces of tenth to twelfth dielectric layers of the stack of the multilayer electronic component according to the embodiment of the present invention.
Figure 7B:
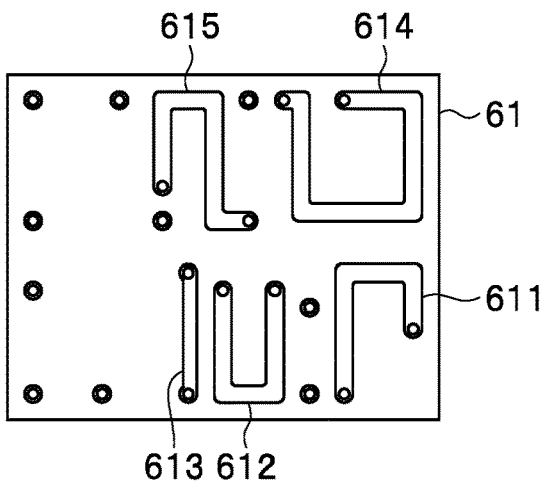
Figure 7C:
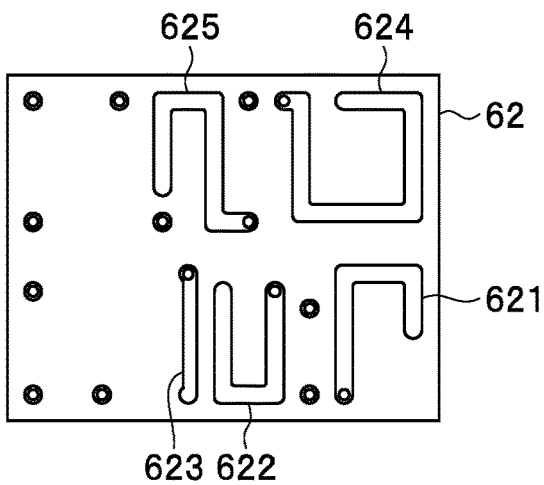

FIG. 7A shows a patterned surface of the tenth dielectric layer 60. Conductor layers 602, 604, and 605 are formed on the patterned surface of the dielectric layer 60. FIG. 7B shows a patterned surface of the eleventh dielectric layer 61. Conductor layers 611, 612, 613, 614, and 615 are formed on the patterned surface of the dielectric layer 61. FIG. 7C shows a patterned surface of the twelfth dielectric layer 62. Conductor layers 621, 622, 623, 624, and 625 are formed on the patterned surface of the dielectric layer 62.

Figure 8A:
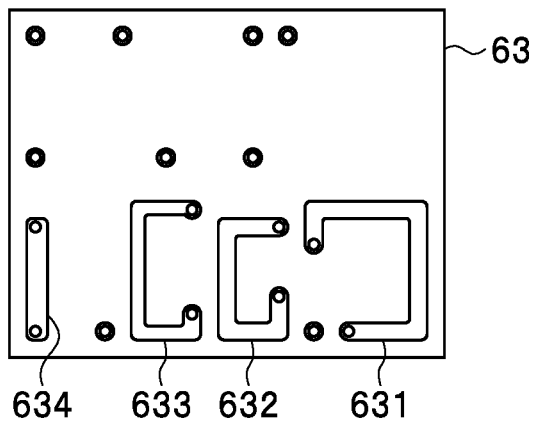
FIG. 8A to FIG. 8C are explanatory diagrams showing respective patterned surfaces of thirteenth to fifteenth dielectric layers of the stack of the multilayer electronic component according to the embodiment of the present invention.
Figure 8B:
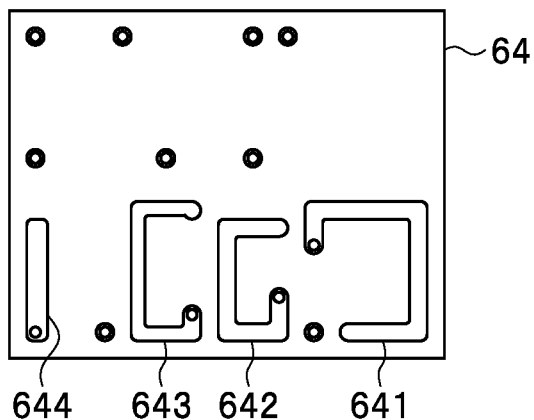
Figure 8C:
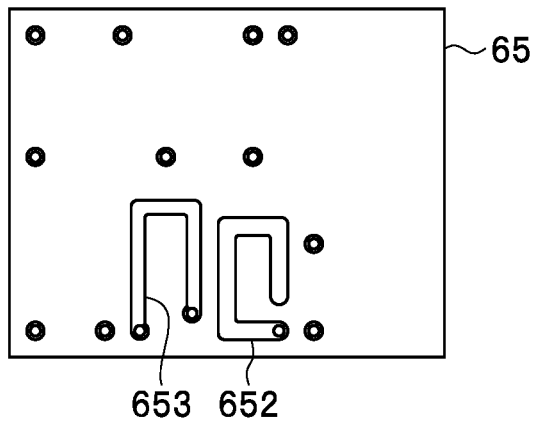

FIG. 8A shows a patterned surface of the thirteenth dielectric layer 63. Conductor layers 631, 632, 633, and 634 are formed on the patterned surface of the dielectric layer 63. FIG. 8B shows a patterned surface of the fourteenth dielectric layer 64. Conductor layers 641, 642, 643, and 644 are formed on the patterned surface of the dielectric layer 64. FIG. 8C shows a patterned surface of the fifteenth dielectric layer 65. Conductor layers 652 and 653 are formed on the patterned surface of the dielectric layer 65.

Figure 9A:
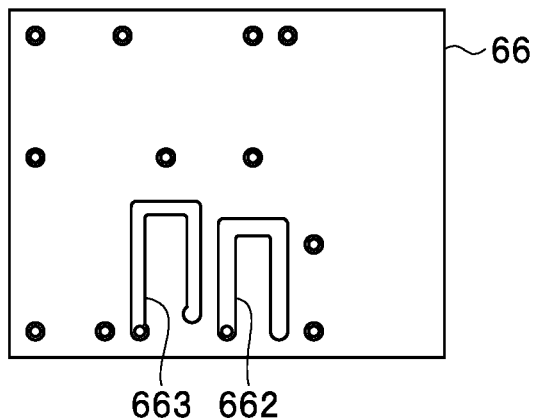
FIG. 9A to FIG. 9C are explanatory diagrams showing respective patterned surfaces of sixteenth to eighteenth dielectric layers of the stack of the multilayer electronic component according to the embodiment of the present invention.
Figure 9B:
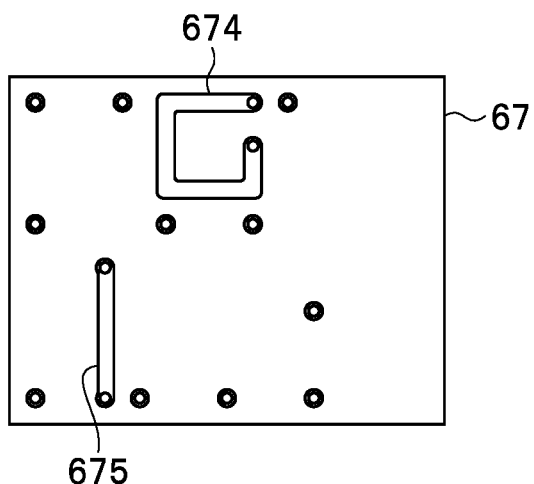
Figure 9C:
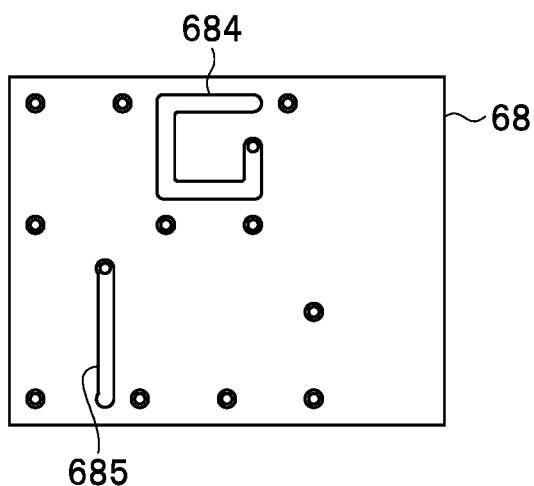

FIG. 9A shows a patterned surface of the sixteenth dielectric layer 66. Conductor layers 662 and 663 are formed on the patterned surface of the dielectric layer 66. FIG. 9B shows a patterned surface of the seventeenth dielectric layer 67. Conductor layers 674 and 675 are formed on the patterned surface of the dielectric layer 67. FIG. 9C shows a patterned surface of the eighteenth dielectric layer 68. Conductor layers 684 and 685 are formed on the patterned surface of the dielectric layer 68.

Figure 10A:
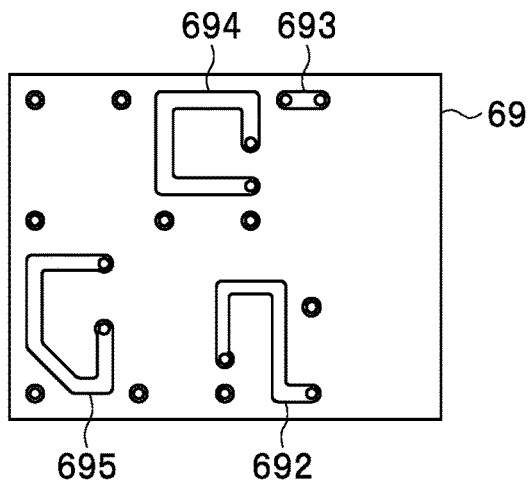
FIG. 10A to FIG. 10C are explanatory diagrams showing respective patterned surfaces of nineteenth to twenty-first dielectric layers of the stack of the multilayer electronic component according to the embodiment of the present invention.
Figure 10B:
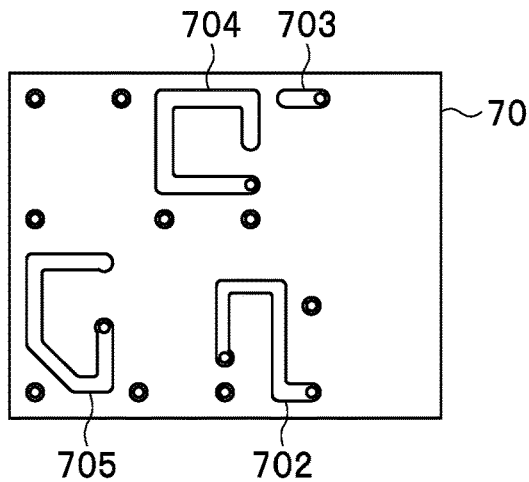
Figure 10C:
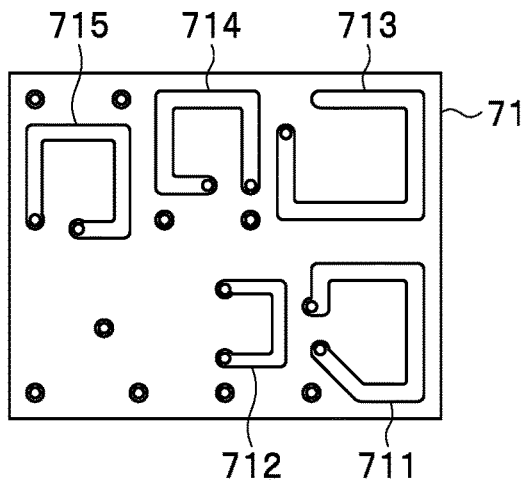

FIG. 10A shows a patterned surface of the nineteenth dielectric layer 69. Conductor layers 692, 693, 694, and 695 are formed on the patterned surface of the dielectric layer 69. FIG. 10B shows a patterned surface of the twentieth dielectric layer 70. Conductor layers 702, 703, 704, and 705 are formed on the patterned surface of the dielectric layer 70. FIG. 10C shows a patterned surface of the twenty-first dielectric layer 71. Conductor layers 711, 712, 713, 714, and 715 are formed on the patterned surface of the dielectric layer 71.

Figure 11A:
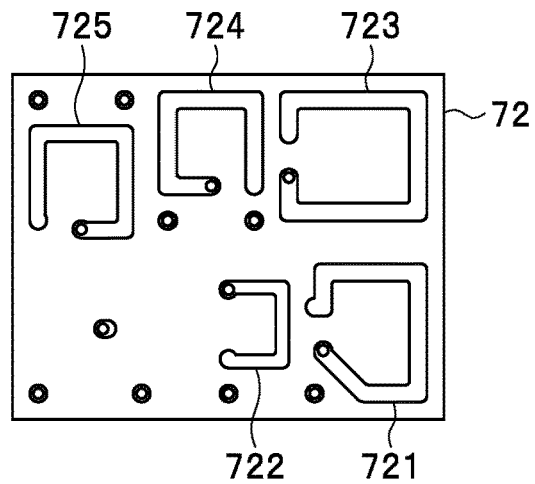
FIG. 11A to FIG. 11C are explanatory diagrams showing respective patterned surfaces of twenty-second to twenty-fourth dielectric layers of the stack of the multilayer electronic component according to the embodiment of the present invention.
Figure 11B:
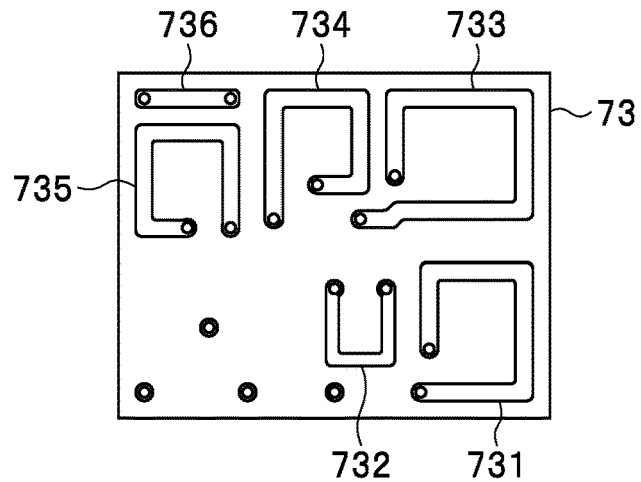
Figure 11C:
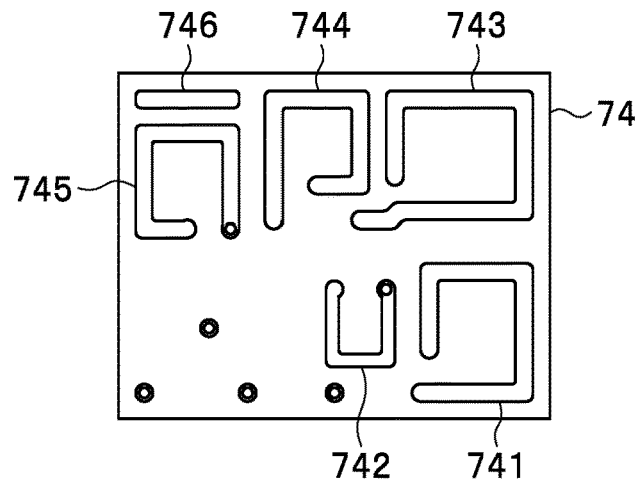

FIG. 11A shows a patterned surface of the twenty-second dielectric layer 72. Conductor layers 721, 722, 723, 724, and 725 are formed on the patterned surface of the dielectric layer 72. FIG. 11B shows a patterned surface of the twenty-third dielectric layer 73. Conductor layers 731, 732, 733, 734, 735, and 736 are formed on the patterned surface of the dielectric layer 73. FIG. 11C shows a patterned surface of the twenty-fourth dielectric layer 74. Conductor layers 741, 742, 743, 744, 745, and 746 are formed on the patterned surface of the dielectric layer 74.

Figure 12A:
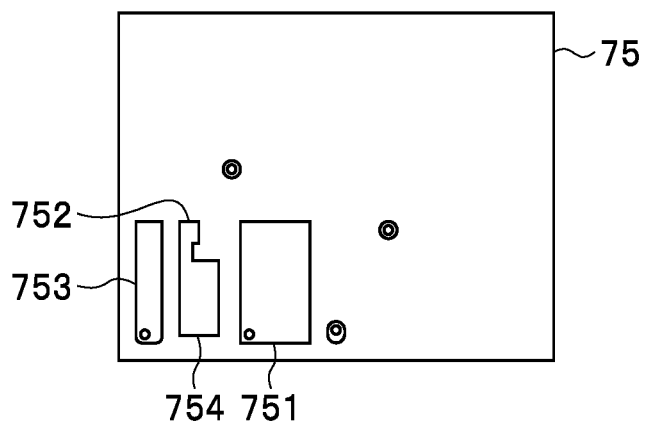
FIG. 12A to FIG. 12C are explanatory diagrams showing respective patterned surfaces of twenty-fifth to twenty-seventh dielectric layers of the stack of the multilayer electronic component according to the embodiment of the present invention.

FIG. 12A shows a patterned surface of the twenty-fifth dielectric layer 75.

Figure 12B:
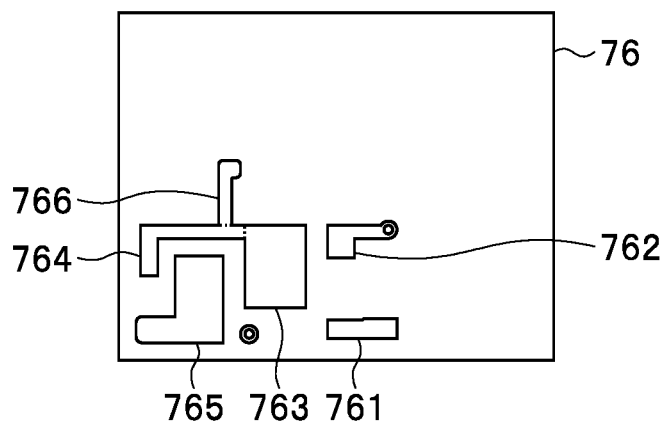
Figure 12C:
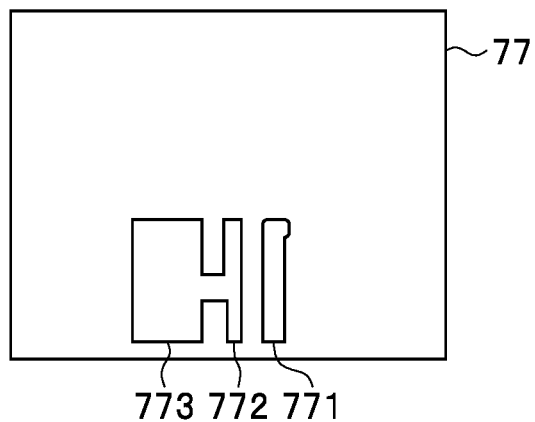

Conductor layers 751, 752, 753, and 754 are formed on the patterned surface of the dielectric layer 75. The conductor layer 754 is connected to the conductor layer 752. FIG. 12B shows a patterned surface of the twenty-sixth dielectric layer 76. Conductor layers 761, 762, 763, 764, 765, and 766 are formed on the patterned surface of the dielectric layer 76. The conductor layer 764 is connected to the conductor layer 763. The conductor layer 766 is connected to the conductor layer 764. In FIG. 12B, the boundary between each two conductor layers is indicated by a dotted line. FIG. 12C shows a patterned surface of the twenty-seventh dielectric layer 77. Conductor layers 771, 772, and 773 are formed on the patterned surface of the dielectric layer 77. The conductor layer 773 is connected to the conductor layer 772.

Figure 13:
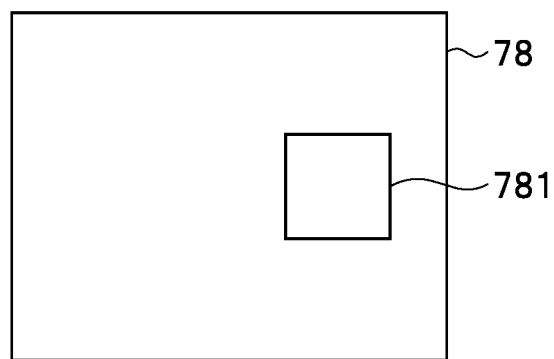
FIG. 13 is an explanatory diagram showing a patterned surface of a twenty-eighth dielectric layer of the stack of the multilayer electronic component according to the embodiment of the present invention.

FIG. 13 shows a patterned surface of the twenty-eighth dielectric layer 78. A mark 781 is formed on the patterned surface of the dielectric layer 78.

The stack 50 shown in FIG. 3 is formed by stacking the first to twenty-eighth dielectric layers 51 to 78 such that the patterned surface of the first dielectric layer 51 serves as the bottom surface 50A of the stack 50 and the surface of the twenty-eighth dielectric layer 78 opposite to the patterned surface thereof serves as the top surface 50B of the stack 50.

Each of the plurality of through holes shown in FIG. 4A to FIG. 12B is connected to a conductor layer overlapping in the stacking direction T when the first to twenty-seventh dielectric layers 51 to 77 are stacked, or to another through hole overlapping in the stacking direction T when the first to twenty-seventh dielectric layers 51 to 77 are stacked. Of the plurality of through holes shown in FIG. 4A to FIG. 12B, the ones located within a terminal or a conductor layer are connected to the terminal or conductor layer.

Figure 14:
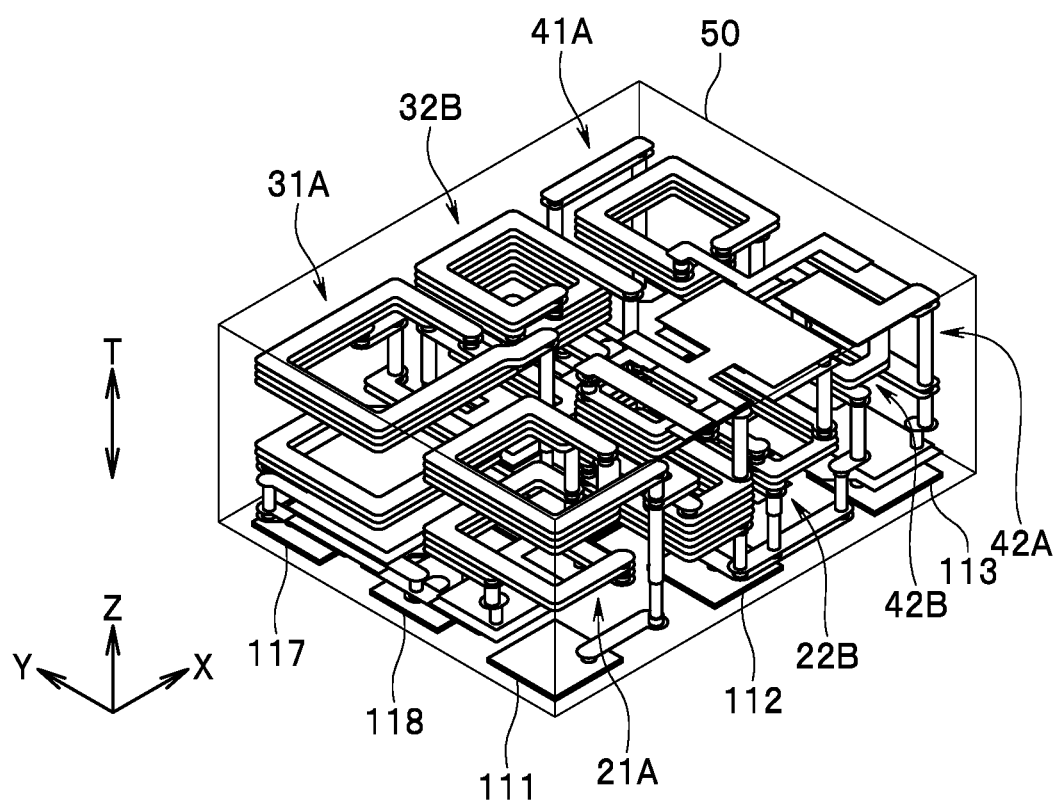
FIG. 14 is a perspective view showing an inside of the stack of the multilayer electronic component according to the embodiment of the present invention.

FIG. 14 shows an inside of the stack 50 formed by stacking the first to twenty-eighth dielectric layers 51 to 78. As shown in FIG. 14, the plurality of conductor layers and the plurality of through holes shown in FIG. 4A to FIG. 12C are stacked together inside the stack 50. In FIG. 14, the mark 781 is omitted.

For example, the stack 50 is fabricated by a low-temperature co-firing method, using ceramic as the material of the dielectric layers 51 to 78. In this case, a plurality of ceramic green sheets, which eventually become the dielectric layers 51 to 78, are fabricated first. Each ceramic green sheet has a plurality of unfired conductor layers formed thereon and a plurality of unfired through holes formed therein. The plurality of unfired conductor layers eventually become a plurality of conductor layers. The plurality of unfired through holes eventually become a plurality of through holes. Next, the plurality of ceramic green sheets are stacked together into a green sheet stack. The green sheet stack is then cut to form an unfired stack. The ceramic and conductor in the unfired stack are then fired by a low-temperature co-firing method to thereby complete the stack 50.

Correspondences between the components of the circuit of the electronic component 1 shown in FIG. 2 and the internal components of the stack 50 shown in FIG. 4B to FIG. 12C will now be described. First, components of the parallel resonant circuit 21A of the first filter 21 will be described. The inductor L21 is constituted by the conductor layers 711, 721, 731, and 741. The inductor L22 is constituted by the conductor layers 611, 621, 631, and 641.

The capacitor C21 is composed of the conductor layers 531 and 541 and the dielectric layer 53 interposed between those conductor layers. The capacitor C22 is composed of the conductor layers 541 and 551 and the dielectric layer 54 interposed between those conductor layers.

Next, components of the serial resonant circuit 22B of the second filter 22 will be described. The inductor L23 is constituted by the conductor layers 692, 702, 712, 722, 732, and 742. The inductor L24 is constituted by the conductor layers 592, 602, 612, 622, 632, 642, 652, and 662. The inductor L25 is constituted by the conductor layers 613, 623, 633, 643, 653, and 663.

The capacitor C23 is composed of the conductor layers 761 and 771 and the dielectric layer 76 interposed between those conductor layers. The capacitor C24 is composed of the conductor layers 761 and 772 and the dielectric layer 76 interposed between those conductor layers. The capacitor C25 is composed of the conductor layers 762 and 772 and the dielectric layer 76 interposed between those conductor layers. The capacitor C26 is composed of the conductor layers 763 and 773 and the dielectric layer 76 interposed between those conductor layers.

Next, components of the parallel resonant circuit 31A of the third filter 31 will be described. The inductor L31 is constituted by the conductor layers 693, 703, 713, 723, 733, and 743. The inductor L32 is constituted by the conductor layers 594, 604, 614, and 624.

The capacitor C31 is composed of the conductor layers 532, 542, 552, and 561 and the dielectric layers 53, 54, and 55 interposed between each two of those conductor layers. The capacitor C32 is composed of the conductor layers 533, 542, 561, and 571 and the dielectric layers 53 and 56 each interposed between each two of those conductor layers.

Next, components of the serial resonant circuit 32B of the fourth filter 32 will be described. The inductor L33 is constituted by the conductor layers 595, 605, 615, and 625. The inductor L34 is constituted by the conductor layers 674, 684, 694, 704, 714, 724, 734, and 744.

The capacitor C33 is composed of the conductor layers 553 and 562 and the dielectric layer 55 interposed between those conductor layers. The capacitor C34 is composed of the conductor layers 534, 543, and 553 and the dielectric layers 53 and 54 interposed between each two of those conductor layers. The capacitor C35 is composed of the conductor layers 535 and 543 and the dielectric layer 53 interposed between those conductor layers.

Next, components of the parallel resonant circuit 41A of the fifth filter 41 will be described. The inductor L41 is constituted by the conductor layers 715, 725, 735, and 745. The inductor L42 is constituted by the conductor layers 736 and 746, a plurality of through holes connected in series to connect the conductor layer 554 and the conductor layer 736, and a plurality of through holes connected in series to connect the conductor layer 544 and the conductor layer 736.

The capacitor C41 is composed of the conductor layers 536 and 544 and the dielectric layer 53 interposed between those conductor layers. The capacitor C42 is composed of the conductor layers 544 and 554 and the dielectric layer 54 interposed between those conductor layers.

Next, components of the serial resonant circuit 42B of the sixth filter 42 will be described. The inductor L43 is constituted by the conductor layers 675, 685, 695, and 705.

The capacitor C43 is composed of the conductor layers 752 and 764 and the dielectric layer 75 interposed between those conductor layers. The capacitor C44 is composed of the conductor layers 753 and 764 and the dielectric layer 75 interposed between those conductor layers. The capacitor C45 is composed of the conductor layers 754 and 765 and the dielectric layer 75 interposed between those conductor layers.

Next, components of the parallel resonant circuit 42A of the sixth filter 42 will be described. The inductor L44 is constituted by the conductor layers 634 and 644, a plurality of through holes connected in series to connect the conductor layer 586 and the conductor layer 634, and a plurality of through holes connected in series to connect the conductor layer 546 and the conductor layer 634. The inductor L45 is constituted by the conductor layer 525.

The capacitor C46 is composed of the conductor layers 537 and 545 and the dielectric layer 53 interposed between those conductor layers. The capacitor C47 is composed of the conductor layers 538 and 546 and the dielectric layer 53 interposed between those conductor layers. The capacitor C48 is composed of the conductor layers 546 and 555 and the dielectric layer 54 interposed between those conductor layers.

Figure 15:
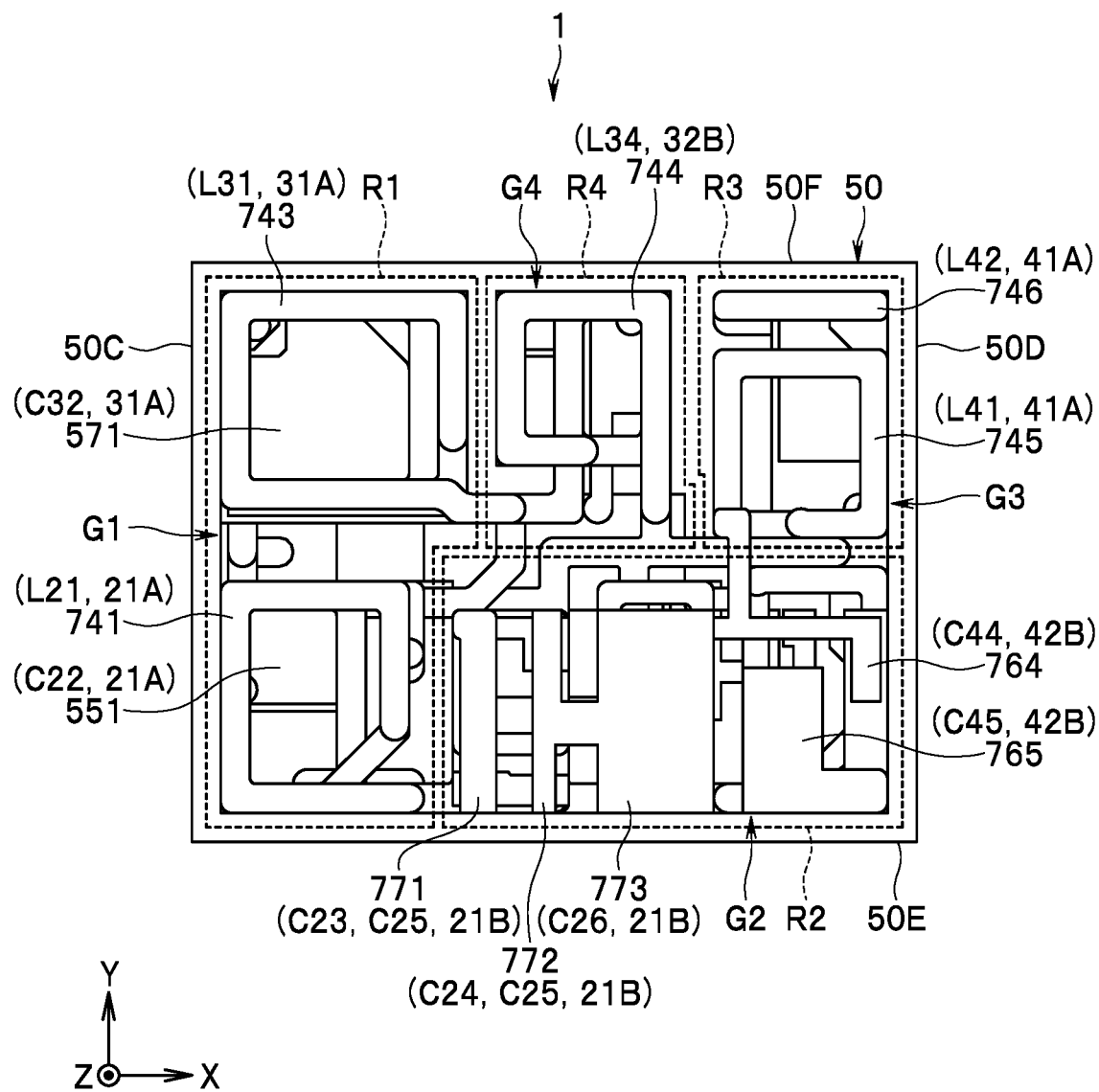
FIG. 15 is a plan view showing an inside of the stack of the multilayer electronic component according to the embodiment of the present invention.

Next, structural features of the electronic component 1 according to the present embodiment will be described with reference to FIG. 2 and FIG. 4A to FIG. 15. FIG. 15 is a plan view showing an inside of the stack 50.

The electronic component 1 includes a plurality of parallel resonant circuits and a plurality of serial resonant circuits. In the present embodiment, in particular, the plurality of parallel resonant circuits include parallel resonant circuits 21A, 31A, 41A, and 42A. The plurality of serial resonant circuits include serial resonant circuits 22B, 32B, and 42B.

The stack 50 includes a plurality of conductors, specifically, a plurality of conductor layers and a plurality of through holes. In the present embodiment, the stack 50 includes a plurality of first conductors and a plurality of second conductors as the plurality of conductors. The plurality of first conductors constitute one of the plurality of parallel resonant circuits and the plurality of serial resonant circuits. The plurality of second conductors constitute the other of the plurality of parallel resonant circuits and the plurality of serial resonant circuits. A description will be given below by using, as an example, a case where the plurality of first conductors constitute the plurality of parallel resonant circuits, and the plurality of second conductors constitute the plurality of serial resonant circuits.

In FIG. 15, four regions R1, R2, R3, and R4 each surrounded by broken lines show regions for arranging the plurality of first conductors and the plurality of second conductors in certain groups. The region R1 is a region along the side surface 50C. The region R2 is a region along the side surface 50E between the region R1 and the side surface 50D. The region R3 is located between the region R2 and the side surface 50F. The region R4 is located between the region R1 and the region R3 and between the region R3 and the side surface 50F. The region R4 is adjacent to the region R1. The region R3 is arranged at a position to sandwich the region R4 with the region R1.

The plurality of first conductors include a first conductor group G1. The plurality of second conductors include a second conductor group G4 arranged in a region adjacent to a region where the first conductor group is arranged. The plurality of first conductors further include a third conductor group G3 adjacent to the region where the second conductor group is arranged and arranged at a position to sandwich, with the region where the first conductor group G1 is arranged, the region where the second conductor group G4 is arranged. In the present embodiment, in particular, the first conductor group G1 is arranged in the region R1, the second conductor group G4 is arranged in the region R4, and the third conductor group G3 is arranged in the region R3.

The first conductor group G1 constitutes at least part of a circuit provided on the first path P1. In the present embodiment, in particular, the first conductor group G1 constitutes the parallel resonant circuits 21A and 31A. The first conductor group G1 includes the conductor layers 531, 532, 533, 541, 542, 551, 552, 561, 571, 594, 604, 611, 614, 621, 624, 631, 641, 693, 703, 711, 713, 721, 723, 731, 733, 741, and 743 and a plurality of through holes connected to those conductor layers.

The second conductor group G4 constitutes at least part of a circuit provided on the second path P2. In the present embodiment, in particular, the second conductor group G4 constitutes the serial resonant circuit 32B. The second conductor group G4 includes the conductor layers 534, 535, 543, 553, 562, 595, 605, 615, 625, 674, 684, 694, 704, 714, 724, 734, and 744 and a plurality of through holes connected to those conductor layers.

The third conductor group G3 constitutes at least part of a circuit provided on the third path P3. In the present embodiment, in particular, the third conductor group G3 constitutes the parallel resonant circuit 41A. The third conductor group G3 includes the conductor layers 536, 544, 554, 715, 725, 735, 736, 745, and 746, a plurality of through holes connected to those conductor layers, a plurality of through holes connected in series to connect the conductor layer 554 and the conductor layer 736, and a plurality of through holes connected in series to connect the conductor layer 544 and the conductor layer 736.

Part of the plurality of first conductors is arranged in the region R1. The part of the plurality of first conductors includes the first conductor group G1. In the present embodiment, in particular, the part of the plurality of first conductors is the first conductor group G1 itself.

Part G2 of the plurality of second conductors is arranged in the region R2. The part G2 of the plurality of second conductors constitutes at least part of a circuit provided on the fourth path P4. In the present embodiment, in particular, the part G2 of the plurality of second conductors constitutes the serial resonant circuits 22B and 42B. The part G2 of the plurality of second conductors includes the conductor layers 592, 602, 612, 613, 622, 623, 632, 633, 642, 643, 652, 653, 662, 663, 675, 685, 692, 695, 702, 705, 712, 722, 732, 742, 752 to 754, 761 to 765, and 771 to 773 and a plurality of through holes connected to those conductor layers.

The plurality of conductors composing the parallel resonant circuit 42A among the plurality of first conductors may be arranged in the region R2 or may be arranged in a region between the region R2 and the side surface 50D. The plurality of conductors correspond to the conductor layers 525, 537, 538, 545, 546, 555, 634, and 644, a plurality of through holes connected to those conductor layers, a plurality of through holes connected in series to connect the conductor layer 586 and the conductor layer 634, and a plurality of through holes connected in series to connect the conductor layer 546 and the conductor layer 634.

Figure 16:
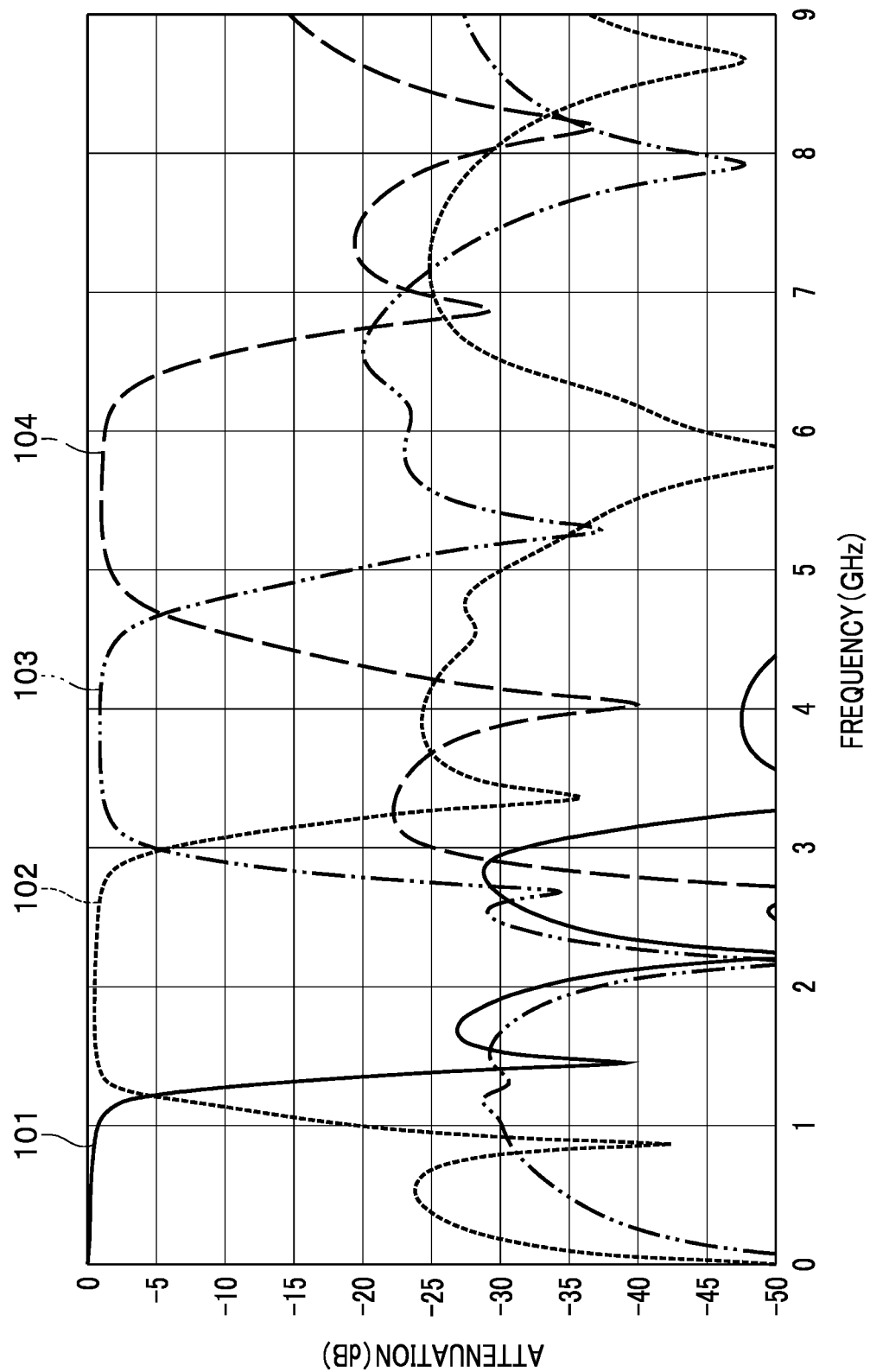
FIG. 16 is a characteristic diagram showing an example of pass attenuation characteristics of the multilayer electronic component according to the embodiment of the present invention.

Next, an example of the characteristics of the electronic component 1 according to the present embodiment will be described. FIG. 16 is a characteristic chart showing pass attenuation characteristics of the electronic component 1. In FIG. 16, the horizontal axis indicates frequency, and the vertical axis indicates the attenuation. In FIG. 16, a reference numeral 101 indicates the pass attenuation characteristics between the input port 10 and the first output port 11. A reference numeral 102 indicates the pass attenuation characteristics between the input port 10 and the second output port 12. A reference numeral 103 indicates the pass attenuation characteristics between the input port 10 and the third output port 13. A reference numeral 104 indicates the pass attenuation characteristics between the input port 10 and the fourth output port 14.

Now, the operation and effects of the electronic component 1 according to the present embodiment will be described. In the present embodiment, the plurality of conductors composing the parallel resonant circuits 21A and 31A are arranged in the region R1, the plurality of conductors composing the serial resonant circuit 32B are arranged in the region R4, and the plurality of conductors composing the parallel resonant circuit 41A are arranged in the region R3. In the present embodiment, the parallel resonant circuits and the serial resonant circuits are aligned alternately along the side surface 50D.

Here, consider a case where two serial resonant circuits are adjacent to each other. In this case, an inductor included in one of the two serial resonant circuits and an inductor included in the other of the two serial resonant circuits are relatively likely to be electromagnetically coupled. Hence, in this case, desired characteristics may not be able to be obtained due to an influence of the electromagnetic coupling. To reduce the influence of the electromagnetic coupling, the distance between the two serial resonant circuits need be increased. However, this leads to a problem that it is difficult to downsize the electronic component including the two serial resonant circuits. This problem also applies to a case where two parallel resonant circuits are adjacent to each other.

In contrast to this, in the present embodiment, parallel resonant circuits and serial resonant circuits are aligned alternately as described above. In a case where resonant circuits of different kinds are adjacent to each other in this way, an influence of electromagnetic coupling can be reduced and also the distance between each two resonators can be reduced, compared with a case where resonant circuits of the same kind are adjacent to each other. Thus, according to the present embodiment, it is possible to downsize the electronic component 1 while reducing an influence of electromagnetic coupling between each two resonant circuits.

The present invention is not limited to the foregoing embodiment, and various modifications may be made thereto. For example, the plurality of first conductors may constitute the plurality of serial resonant circuits, and the plurality of second conductors may constitute the plurality of parallel resonant circuits. In this case, the parallel resonant circuits and the serial resonant circuits may be aligned alternately so as to arrange each parallel resonant circuit between two serial resonant circuits.

As described above, a multilayer electronic component of the present invention includes: an input terminal; a plurality of output terminals; a plurality of parallel resonant circuits; a plurality of serial resonant circuits; and a stack including a plurality of dielectric layers stacked together, a plurality of first conductors, and a plurality of second conductors. The plurality of first conductors constitute one of the plurality of parallel resonant circuits and the plurality of serial resonant circuits. The plurality of second conductors constitute the other of the plurality of parallel resonant circuits and the plurality of serial resonant circuits. The plurality of first conductors include a first conductor group. The plurality of second conductors include a second conductor group arranged in a region adjacent to a region where the first conductor group is arranged. The plurality of first conductors further include a third conductor group arranged in a region adjacent to the region where the second conductor group is arranged and located to sandwich, with the region where the first conductor group is arranged, the region where the second conductor group is arranged.

The plurality of output terminals include a first terminal, a second terminal, and a third terminal. The first conductor group constitutes at least part of a circuit provided on a path connecting the input terminal and the first terminal. The second conductor group constitutes at least part of a circuit provided on a path connecting the input terminal and the second terminal. The third conductor group constitutes at least part of a circuit provided on a path connecting the input terminal and the third terminal.

In the multilayer electronic component of the present invention, the stack may include a first side surface and a second side surface. Part of the plurality of first conductors may be arranged in a first region along the first side surface. Part of the plurality of second conductors may be arranged in a second region along the second side surface. The part of the plurality of first conductors arranged in the first region may include the first conductor group. The second conductor group may be arranged in a region adjacent to the first region. The third conductor group may be arranged in a region adjacent to the second region. The plurality of output terminals may further include a fourth terminal. Part of the plurality of second conductors arranged in the second region may constitute at least part of a circuit provided on a path connecting the input terminal and the fourth terminal.

In the multilayer electronic component of the present invention, the plurality of first conductors may constitute the plurality of parallel resonant circuits. The plurality of second conductors may constitute the plurality of serial resonant circuits.

Obviously, various modifications and variations of the present invention are possible in the light of the above teachings. Thus, it is to be understood that, within the scope of the appended claims and equivalents thereof, the present invention may be practiced in other embodiments than the foregoing most preferable embodiment.

What is claimed is:

1. A multilayer electronic component comprising:
an input terminal;
a plurality of output terminals;
a plurality of parallel resonant circuits;
a plurality of serial resonant circuits;
a stack including a plurality of dielectric layers stacked together, a plurality of first conductors, and a plurality of second conductors;
a first inductor;
a second inductor; and
a third inductor, wherein
the first inductor and the third inductor are included in one of the plurality of parallel resonant circuits or the plurality of serial resonant circuits,
the second inductor is included in the other of the plurality of parallel resonant circuits or the plurality of serial resonant circuits;
the plurality of first conductors constitute the one of the plurality of parallel resonant circuits or the plurality of serial resonant circuits, and does not constitute the other of the plurality of parallel resonant circuits or the plurality of serial resonant circuits,
the plurality of second conductors constitute the other of the plurality of parallel resonant circuits or the plurality of serial resonant circuits, and does not constitute the one of the plurality of parallel resonant circuits or the plurality of serial resonant circuits,
the plurality of first conductors include a first conductor group,
the plurality of second conductors include a second conductor group arranged in a region adjacent to a region where the first conductor group is arranged,
the plurality of first conductors further include a third conductor group arranged in a region adjacent to the region where the second conductor group is arranged and located to sandwich, with the region where the first conductor group is arranged, the region where the second conductor group is arranged, the plurality of output terminals include a first terminal, a second terminal, and a third terminal, the first conductor group includes a first conductor layer constituting the first inductor, and constitutes at least part of a circuit provided on a path connecting the input terminal and the first terminal, the second conductor group includes a second conductor layer constituting the second inductor, and constitutes at least part of a circuit provided on a path connecting the input terminal and the second terminal, the third conductor group includes a third conductor layer constituting the third inductor, and constitutes at least part of a circuit provided on a path connecting the input terminal and the third terminal, the stack includes a bottom surface that is located at a lower end in a stacking direction of the plurality of dielectric layers, a top surface that is located at an upper end in the stacking direction of the plurality of dielectric layers, and a first side surface, a second side surface, a third side surface, and a fourth side surface connecting the bottom surface and the top surface, the first side surface and the second side surface are opposite to each other, the third side surface and the fourth side surface are opposite to each other, and all of the first conductor layer, the second conductor layer, and the third conductor layer are arranged at positions closer to the second side surface than to the first side surface.

2. The multilayer electronic component according to claim 1, wherein part of the plurality of first conductors is arranged in a first region along the third side surface, and part of the plurality of second conductors is arranged in a second region along the second side surface.

3. The multilayer electronic component according to claim 2, wherein the part of the plurality of first conductors arranged in the first region includes the first conductor group.

4. The multilayer electronic component according to claim 2, wherein the second conductor group is arranged in a region adjacent to the first region.

5. The multilayer electronic component according to claim 2, wherein the third conductor group is arranged in a region adjacent to the second region.

6. The multilayer electronic component according to claim 2, wherein the plurality of output terminals further include a fourth terminal, and the part of the plurality of second conductors arranged in the second region constitutes at least part of a circuit provided on a path connecting the input terminal and the fourth terminal.

7. A multilayer electronic component comprising:

an input terminal;

a plurality of output terminals;

a plurality of parallel resonant circuits;

a plurality of serial resonant circuits; and a stack including a plurality of dielectric layers stacked together, a plurality of first conductors, and a plurality of second conductors, wherein the plurality of first conductors constitute one of the plurality of parallel resonant circuits and the plurality of serial resonant circuits, the plurality of second conductors constitute another of the plurality of parallel resonant circuits and the plurality of serial resonant circuits, the plurality of first conductors include a first conductor group, the plurality of second conductors include a second conductor group arranged in a region adjacent to a region where the first conductor group is arranged, the plurality of first conductors further include a third conductor group arranged in a region adjacent to the region where the second conductor group is arranged and located to sandwich, with the region where the first conductor group is arranged, the region where the second conductor group is arranged, the plurality of output terminals include a first terminal, a second terminal, and a third terminal, the first conductor group constitutes at least part of a circuit provided on a path connecting the input terminal and the first terminal, the second conductor group constitutes at least part of a circuit provided on a path connecting the input terminal and the second terminal, and the third conductor group constitutes at least part of a circuit provided on a path connecting the input terminal and the third terminal, the plurality of first conductors constitute the plurality of parallel resonant circuits, and the plurality of second conductors constitute the plurality of serial resonant circuits.

\* \* \* \* \*